(12) United States Patent
Wang (10) Patent No.: US 9,269,820 B2
(45) Date of Patent: Feb. 23, 2016

(54) MANUFACTURING METHOD OF POLYSILICON LAYER, AND POLYSILICON THIN FILM TRANSISTOR AND MANUFACTURING METHOD THEREOF

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventor: Zuqiang Wang, Beijing (CN)

(73) Assignees: ORDOS YUANSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/348,699

(22) PCT Filed: Nov. 11, 2013

(86) PCT No.: PCT/CN2013/086884
§ 371 (c)(1),
(2) Date: Mar. 31, 2014

(87) PCT Pub. No.: WO2014/139291
PCT Pub. Date: Sep. 18, 2014

(65) Prior Publication Data
US 2015/0155390 A1      Jun. 4, 2015

(30) Foreign Application Priority Data

Mar. 11, 2013   (CN) .......................... 2013 1 0076693

(51) Int. Cl.
*H01L 29/786*   (2006.01)
*H01L 21/02*    (2006.01)
(Continued)

(52) U.S. Cl.
CPC .... *H01L 29/78672* (2013.01); *H01L 21/02532* (2013.01); *H01L 21/02592* (2013.01);
(Continued)

(58) Field of Classification Search
CPC .............. H01L 27/1274; H01L 21/02667; H01L 27/1288; H01L 21/02532; H01L 21/3081; H01L 21/3083; H01L 21/02694; H01L 21/02645; H01L 21/02642; H01L 21/30604; H01L 21/02592; H01L 29/16; H01L 29/6675; H01L 21/02686; H01L 27/1277
See application file for complete search history.

(56) References Cited

U.S. PATENT DOCUMENTS 5,773,357 A * 6/1998 Shishiguchi .................. 438/479
6,933,527 B2 * 8/2005 Isobe et al. ..................... 257/59
(Continued)

FOREIGN PATENT DOCUMENTS

CN           1388565 A      1/2003
CN         102709160 A     10/2012
(Continued)

OTHER PUBLICATIONS

International Search Report mailed Feb. 20, 2014; PCT/CN2013/086884.
(Continued)

*Primary Examiner* — Latanya N Crawford
(74) *Attorney, Agent, or Firm* — Ladas & Parry LLP (57) ABSTRACT

A manufacturing method of a polysilicon layer and a manufacturing method of a polysilicon thin film transistor. The manufacturing method of the polysilicon layer includes: providing a substrate; forming a barrier layer and a buffer layer on the substrate; disposing a plurality of grooves in the buffer layer by a patterning process, and forming crystal seeds on the buffer layer; forming an amorphous silicon layer on the buffer layer provided with the grooves and on the crystal seeds; transferring the amorphous silicon layer into a polysilicon layer using a thermal treatment process.

15 Claims, 7 Drawing Sheets

(51) Int. Cl.
- *H01L 27/12* (2006.01)
- *H01L 21/306* (2006.01)
- *H01L 21/308* (2006.01)
- *H01L 29/04* (2006.01)
- *H01L 29/16* (2006.01)
- *H01L 29/66* (2006.01)

(52) U.S. Cl.
CPC .... *H01L21/02642* (2013.01); *H01L 21/02645* (2013.01); *H01L 21/02667* (2013.01); *H01L 21/02675* (2013.01); *H01L 21/02686* (2013.01); *H01L 21/02694* (2013.01); *H01L 21/3081* (2013.01); *H01L 21/3083* (2013.01); *H01L 21/30604* (2013.01); *H01L 27/1277* (2013.01); *H01L 27/1288* (2013.01); *H01L 29/04* (2013.01); *H01L 29/16* (2013.01); *H01L 29/6675* (2013.01)

(56) References Cited

U.S. PATENT DOCUMENTS

| | | | |
|---|---|---|---|
| 2002/0182341 A1 | 12/2002 | Jung | |
| 2002/0192956 A1* | 12/2002 | Kizilyalli et al. | 438/689 |
| 2003/0010980 A1* | 1/2003 | Yamazaki et al. | 257/65 |
| 2005/0012099 A1* | 1/2005 | Couillard et al. | 257/66 |
| 2005/0106841 A1* | 5/2005 | I-Chang | 438/487 |
| 2005/0206304 A1* | 9/2005 | Kim | 313/504 |
| 2009/0325366 A1* | 12/2009 | Moriya et al. | 438/478 |
| 2014/0065804 A1 | 3/2014 | Tian et al. | |

FOREIGN PATENT DOCUMENTS

| | | |
|---|---|---|
| CN | 103219228 A | 7/2013 |
| JP | 2008-004812 A | 1/2008 |

OTHER PUBLICATIONS

First Chinese Office Action date Mar. 2, 2015; Appln. No. 201310076693.8.

International Preliminary Report on Patentability Appln. No. PCT/CN2013/286884; Dated Sep. 15, 2015.

* cited by examiner

MANUFACTURING METHOD OF POLYSILICON LAYER, AND POLYSILICON THIN FILM TRANSISTOR AND MANUFACTURING METHOD THEREOF

FIELD OF THE INVENTION

Embodiments of the present invention relate to a manufacturing method of a polysilicon layer, and a polysilicon thin film transistor and a manufacturing method thereof.

BACKGROUND

The existing displayers are mostly based on amorphous silicon (a-Si), i.e. the thin film transistors (TFT) on the display panels are mostly made of amorphous silicon semiconductor materials. But in comparison, polysilicon (Poly-Si) has a higher electron mobility and has been deemed as a better TFT manufacturing method than amorphous silicon.

The current method of preparing a polysilicon TFT normally comprises: firstly preparing an amorphous silicon layer; transferring the amorphous silicon layer into a polysilicon layer using an excimer laser annealing (ELA) method; and finally forming the thin film transistor according to conventional workflow. The inventor finds at least the following problems in the current method: more defects (e.g. grain boundary defect, grain non-uniformity) in the process of forming the polysilicon, poor uniformity of the resultant polysilicon layer, and thus poor electric performance and reliability of the polysilicon thin film transistor.

SUMMARY

Embodiments of the present invention provide a manufacturing method of a polysilicon layer, and a polysilicon thin film transistor and a manufacturing method thereof, wherein the polysilicon layer to be formed has a high degree of crystallization, uniform grain and less grain boundary defect, so that the electric performance and reliability of the polysilicon thin film transistor have been improved.

In order to solve the above technical problems, the embodiments of the present invention provide the following technical solutions:

A manufacturing method of a polysilicon layer, comprising:
providing a substrate;
forming a buffer layer on the substrate;
disposing a plurality of grooves in the buffer layer by a patterning process, and forming crystal seeds on the buffer layer;
forming an amorphous silicon layer on the buffer layer provided with the grooves and on the crystal seeds;
transferring the amorphous silicon layer into a polysilicon layer using a thermal treatment process.

In one example, the plurality of grooves is arranged respectively along a first direction and a second direction intersecting the first direction to form an interleaved groove pattern.

In one example, at least one of the crystal seeds is arranged on the buffer layer of a region surrounded by the adjacent grooves.

In one example, the step of disposing a plurality of grooves in the buffer layer by patterning process and forming crystal seeds on the buffer layer comprises:
forming a first amorphous silicon layer on the buffer layer;
transferring the first amorphous silicon layer into a first polysilicon layer;
applying photoresist on the first polysilicon layer; after a multi-tone or half-tone exposure and development, forming a photoresist-completely-removed first window region at a predetermined position where the grooves are subsequently formed, forming photoresist with a second thickness at a predetermined position where the crystal seeds are subsequently formed, and forming photoresist with a first thickness in other regions, the second thickness being greater than the first thickness;
etching to remove the first polysilicon layer and a part of the buffer layer exposed from the first window region to form the grooves;
ashing to remove the photoresist with the first thickness;
etching to remove the first polysilicon layer to be exposed;
ashing to remove a remaining part of the photoresist with the second thickness, to form the crystal seeds.

In one example, the first amorphous silicon layer has a thickness of 10-20 nm.

In one example, the manufacturing method of the polysilicon layer further comprises:
passivating the polysilicon layer directly above the grooves in order to reduce grain boundary defects.

In one example, the step of passivating the polysilicon layer directly above the grooves in order to reduce grain boundary defects comprises:
applying photoresist on the polysilicon layer; after exposure and development, forming a photoresist-completely-removed second window region at a position corresponding to the grooves;
performing ion implantation to passivate the polysilicon layer exposed from the second window region;
removing the remaining photoresist.

In one example, the grooves have a width of 5-10 μm, and an interval between the grooves is 10-20 μm.

In one example, the thermal treatment process is a solid phase crystallization method or an excimer laser annealing method.

In one example, prior to forming the buffer layer, the method further comprises:
forming a barrier layer on the substrate.

In one example, after forming an amorphous silicon layer on the buffer layer provided with the grooves and on the crystal seeds and prior to transferring the amorphous silicon layer into a polysilicon layer using a thermal treatment process, the method further comprises:
performing annealing and surface treatment on the amorphous silicon layer.

The embodiments of the present invention further provide a manufacturing method of a polysilicon thin film transistor, comprising forming a polysilicon layer using any of the aforementioned manufacturing methods of the present invention, the polysilicon layer being used to form an active layer of the polysilicon thin film transistor.

The embodiments of the present invention further provide a polysilicon thin film transistor, whose active layer is formed by the polysilicon layer manufactured by the aforementioned manufacturing method of polysilicon layer.

The embodiments of the present invention further provide an array substrate, comprising the aforementioned polysilicon thin film transistor.

The embodiments of the present invention further provide a display device, comprising the aforementioned array substrate.

The embodiments of the present invention provide a manufacturing method of a polysilicon layer, a manufacturing method of a polysilicon thin film transistor, a polysilicon thin film transistor manufactured by the method in the embodiments, and an array substrate and a display device provided with said polysilicon thin film transistor. The manufacturing method of the polysilicon layer pre-arranges grooves and crystal seeds in the buffer layer, and then forms an amorphous layer on the buffer layer and transfers the amorphous silicon layer into a polysilicon layer using a thermal treatment process. When the amorphous silicon is melted and re-crystallized in the thermal treatment process, the grooves in the buffer layer may provide extension space for the growth of the amorphous silicon in a melted state so as to lower the height of grain boundary, while the crystal seeds may provide crystal nucleus for the growth of the amorphous silicon so as to speed up or promote the growth of specific crystal form. Therefore, the polysilicon formed by the manufacturing method of the embodiments of the present invention has a high degree of crystallization, uniform grain and less grain boundary defect, so that the electric performance and reliability of the polysilicon thin film transistor have been improved, and thus the reliability and display effect of the array substrate and the display device have been improved.

BRIEF DESCRIPTION OF THE DRAWINGS

In order to clearly illustrate the technical solution of the embodiments of the invention, the illustrative drawings used for describing the embodiments will be briefly described in the following. It is obvious that the described drawings are only related to some embodiments of the invention and thus are not limitative of the invention.

FIGS. 2 (a)-(e) are respectively cross-sectional schematic views of various film layers on a substrate in steps 11-15 of the manufacturing method of the polysilicon layer in the embodiment of the present invention;

FIGS. 5 (a) and (b) are respectively cross-sectional schematic views of the film layers on the substrate after steps 1031 and 1032;

FIGS. 6 (a)-(e) are respectively cross-sectional schematic views of the film layers on the substrate after steps 1033-1037;

FIGS. 7 (a) and (b) are micrographs analyzing the surface of the polysilicon manufactured by traditional method (a) and that by the method in the embodiments of the present invention (b) by an atomic force microscope (AFM);

DETAILED DESCRIPTION

In order to make the object, technical solution and advantages of the present invention clearer, the technical solutions in the embodiments of the present invention will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Embodiments

Figure 1:
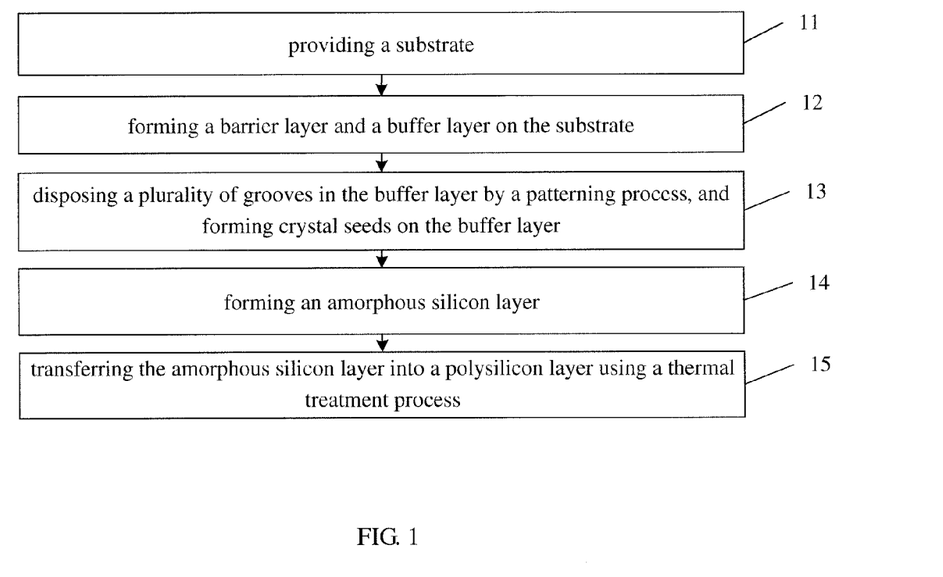
FIG. 1 is a flow chart of a manufacturing method of the polysilicon layer in an embodiment of the present invention.
Figure 2:
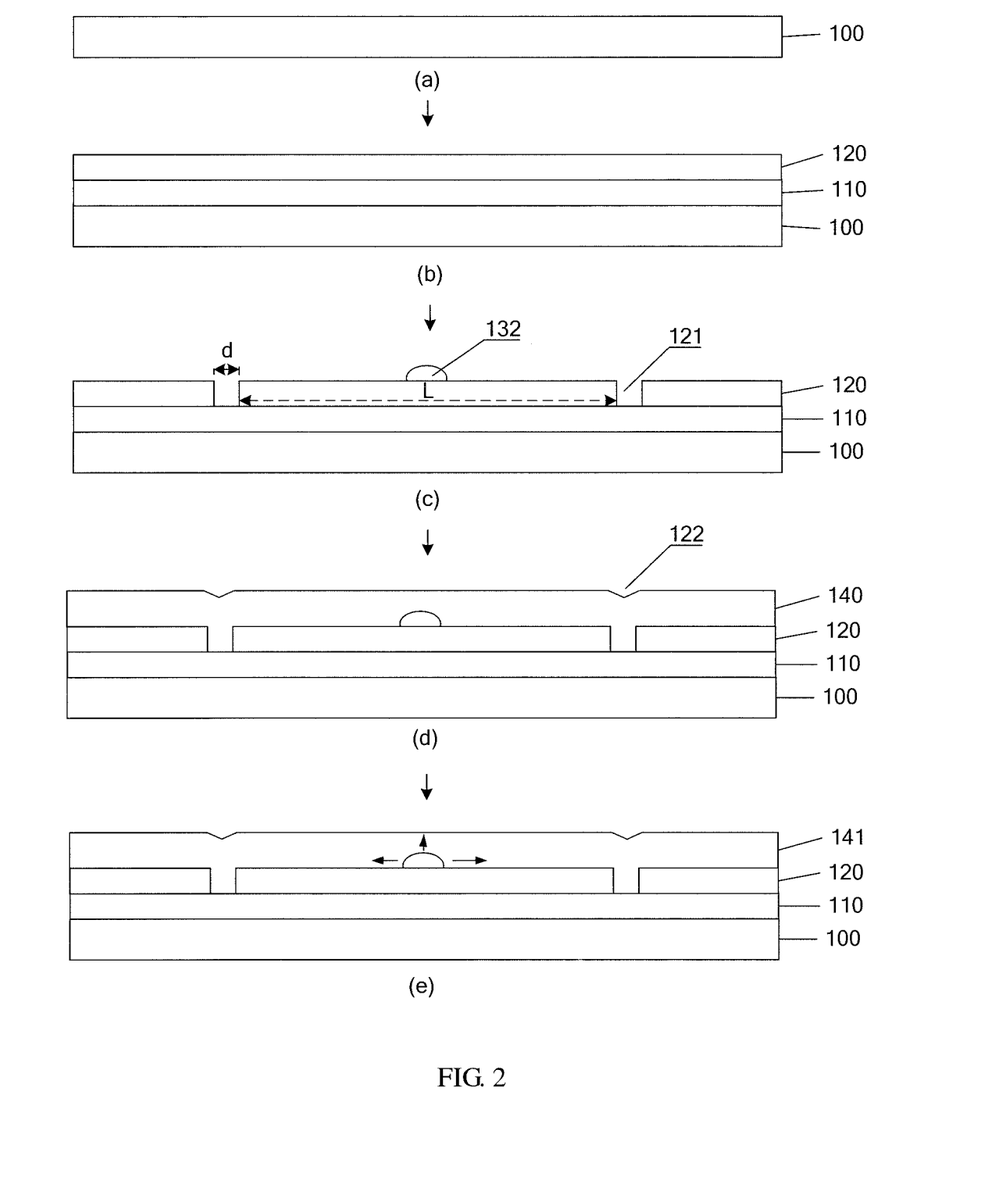

The embodiments of the present invention provide a manufacturing method of a polysilicon layer. As illustrated in FIGS. 1 and 2, the method comprises:

11. providing a substrate 100;

This step performs cleaning treatment on the substrate 100, and the substrate 100 may be a glass substrate or other substrates.

12. as illustrated in FIG. 2(b), sequentially forming a barrier layer 110 and a buffer layer 120 on the substrate;

The barrier layer 110 is disposed between the substrate 100 and the buffer layer 120, and may prevent the substrate 100 from being etched in the subsequent step of forming grooves in the buffer layer 120. In practice, the buffer layer 120 may also be directly formed on the substrate 100, and the barrier layer 110 may be omitted.

Optionally, this step may continuously deposit the barrier layer 110 and the buffer layer 120 on the substrate 100 using a plasma enhanced chemical vapor deposition (PECVD) method.

13. as illustrated in FIG. 2(c), disposing a plurality of grooves 121 in the buffer layer 120 by a patterning process, and forming crystal seeds 132 on the buffer layer;

This step disposes a plurality of grooves 121 in the buffer layer 120, for providing extension space for the growth of the amorphous silicon in a melted state so as to lower the height of grain boundary upon the amorphous silicon being melted and re-crystallized; and it arranges crystal seeds 132 on the surface of the buffer layer 120, for providing crystal nucleus for the growth of the amorphous silicon so as to speed up or promote the growth of specific crystal form.

It may be determined according to the practical situations how to dispose the grooves 121 in the buffer layer 120, how to arrange the grooves 121, and the specific values of width d and interval L of the grooves 121 and etc. Only one preferable embodiment will be described as an example hereinafter.

Figure 3:
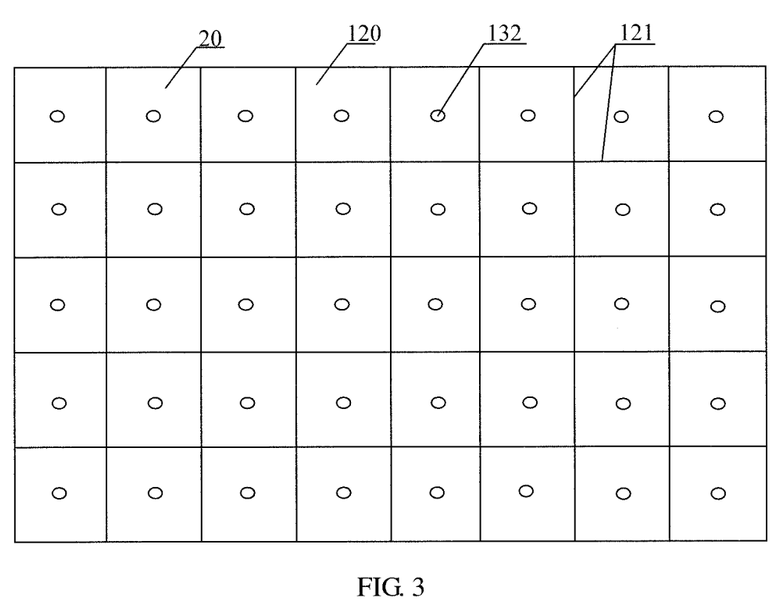
FIG. 3 is a front top view of a buffer layer provided with grooves and the crystal seeds thereon in the embodiment of the present invention.

Preferably, as illustrated in FIG. 3, the plurality of grooves 121 in the present embodiment is arranged respectively along a first direction (lateral direction) and a second direction (longitudinal direction) intersecting the first direction to form an interleaved groove pattern. Further preferably, at least one of the crystal seeds 132 is arranged on the buffer layer of a region surrounded by the adjacent grooves 121. To be specific, in one preferable embodiment, a lattice region 20 is surrounded by two adjacent longitudinal grooves and two adjacent lateral grooves, and one crystal seed 132 is disposed on the buffer layer in each lattice region 20.

Optionally, the grooves have a width d of 5-10 μm, and an interval L between the grooves is 10-20 μm.

Figure 4:
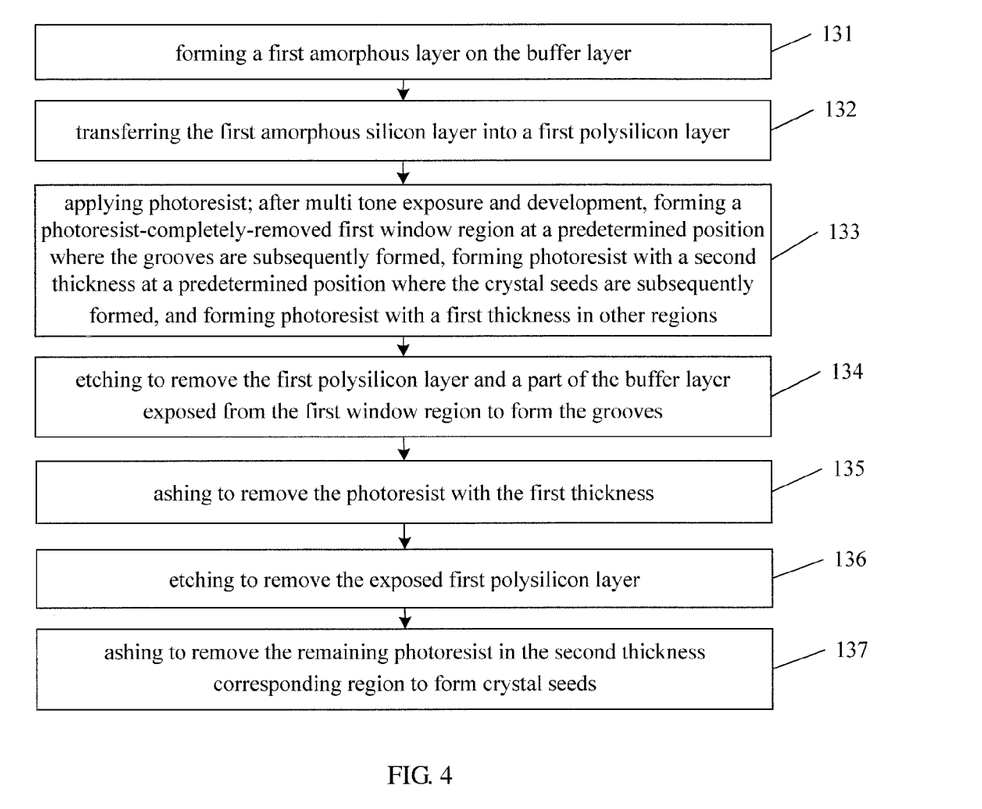
FIG. 4 is a flow chart of forming the grooves and crystal seeds on the buffer layer in step 103 in the embodiment of the present invention.

To be specific, step 13 may dispose a plurality of grooves in the buffer layer 120 by a patterning process and form crystal seeds 132 on the surface of the buffer layer 120, as illustrated in FIG. 4, comprising:

131. forming a first amorphous layer 130 on the buffer layer 120;

In practice, as illustrated in FIG. 5(a), the plasma enhanced chemical vapor deposition (PECVD) method may be used to continuously deposit the barrier layer 110, the buffer layer 120 and the first amorphous silicon layer 130 on the substrate 100, optionally, the first amorphous silicon layer 130 has a thickness of 10-20 nm.

Figure 5:
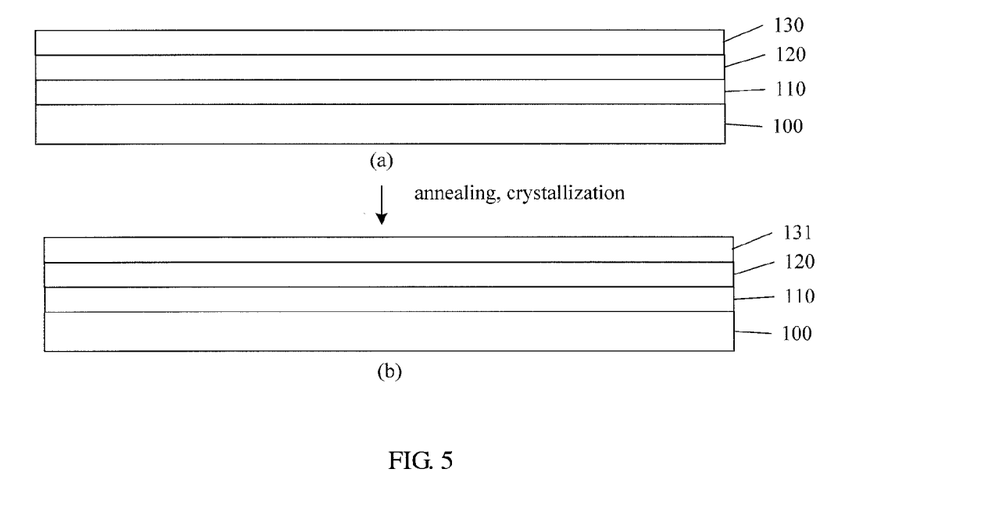

132. As illustrated in FIG. 5 (b), transferring the first amorphous silicon layer 130 into a first polysilicon layer 131.

This step may adopt a Low Temperature Poly-Silicon (LTPS) technique to anneal and crystallize the first amorphous silicon layer 130, wherein the crystallization process is preferably an excimer laser annealing (ELA) method, and may also be a solid phase crystallization method.

Figure 6:
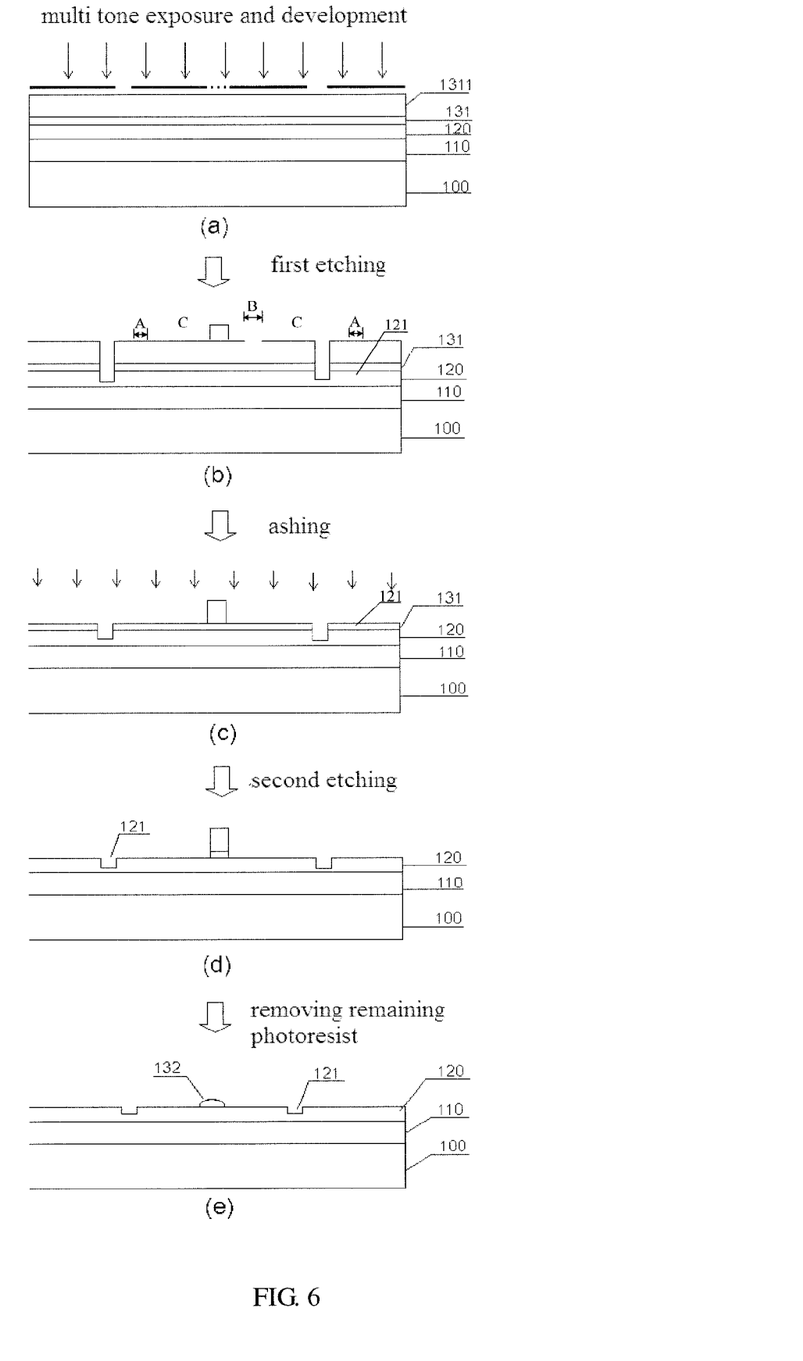

The following steps (133-137) are as illustrated in FIGS. 6 (a)-(e).

133. coating the first polysilicon layer 131 with photoresist 1311; after multi tone exposure and development, forming, a photoresist-completely-removed first window region (region A) at a predetermined position where the grooves are subsequently formed, forming photoresist with a second thickness at a predetermined position (region B) where the crystal seeds are subsequently formed, and forming photoresist with a first thickness in other regions (region C), the second thickness being greater than the first thickness;

The multi tone exposure in this step means the exposure using a Multi Tone Mask (MTM) after coating with the photoresist. Since the light intensities through different parts of the multi tone mask are different from each other, the exposure intensities of corresponding parts of the photoresist are different from each other, and photoresist patterns with different thicknesses of photoresist may be obtained after development.

134. etching (i.e. the first etching) to remove the first polysilicon layer 131 and a part of the buffer layer 120 exposed from the first window region (region A) to form the grooves 121 of the buffer layer;

135. ashing to remove the photoresist with the first thickness;

Optionally, this step uses plasma to etch (ash) the photoresist to remove the photoresist of the photoresist region (B region) with the first thickness, and at the same time, the photoresist in the second thickness corresponding region (B region) will also be thinned.

136. etching (i.e. the second etching) to remove the exposed first polysilicon layer 131;

This step removes the first polysilicon layer 131 in the first thickness photoresist corresponding region (C region) and keeps the polysilicon layer in the photoresist covering region (B region) only.

137. ashing to remove the remaining photoresist in the second thickness corresponding region (B region) to form crystal seeds. In this case, the crystal seeds 132 are distributed on the buffer layer 120. In a preferable embodiment, the grooves 121 and the crystal seeds 132 are distributed on the buffer layer 120 as illustrated in FIG. 3, i.e. the grooves 121 interleave each other to define a plurality of lattice regions 20, the buffer layer in each of which lattice regions 20 is provided with a crystal seed 132, and preferably, the crystal seed 132 is arranged at a central position of the lattice region 20.

14. as illustrated in FIG. 2 (d), forming an amorphous silicon layer 140 on the buffer layer 120 provided with the grooves 121 and on the crystal seeds 132;

15. as illustrated in FIG. 2 (e), transferring the amorphous silicon layer 140 into a polysilicon layer 141 using a thermal treatment process.

Step 14 forms the amorphous silicon layer 140 on the buffer layer 120 and the crystal seeds 132, and forms the second polysilicon layer 141 using a thermal treatment process, as illustrated in FIG. 2 (e). What is corresponding to the groove 121 of the buffer layer is an amorphous silicon recess band 122. During the process of crystallization, the polysilicon seeds (i.e. the crystal seeds 132) play the role of inducing re-growth of the silicon atom (indicated by the arrows in the figure), which may improve the crystallization efficiency. The grooves 121 of the buffer layer have the effect of buffering during crystallization, i.e. providing extension space for the growth of the amorphous silicon, which effectively reduces grain boundary defects, lowers roughness of the polysilicon surface and improves uniformity thereof.

Figure 7:
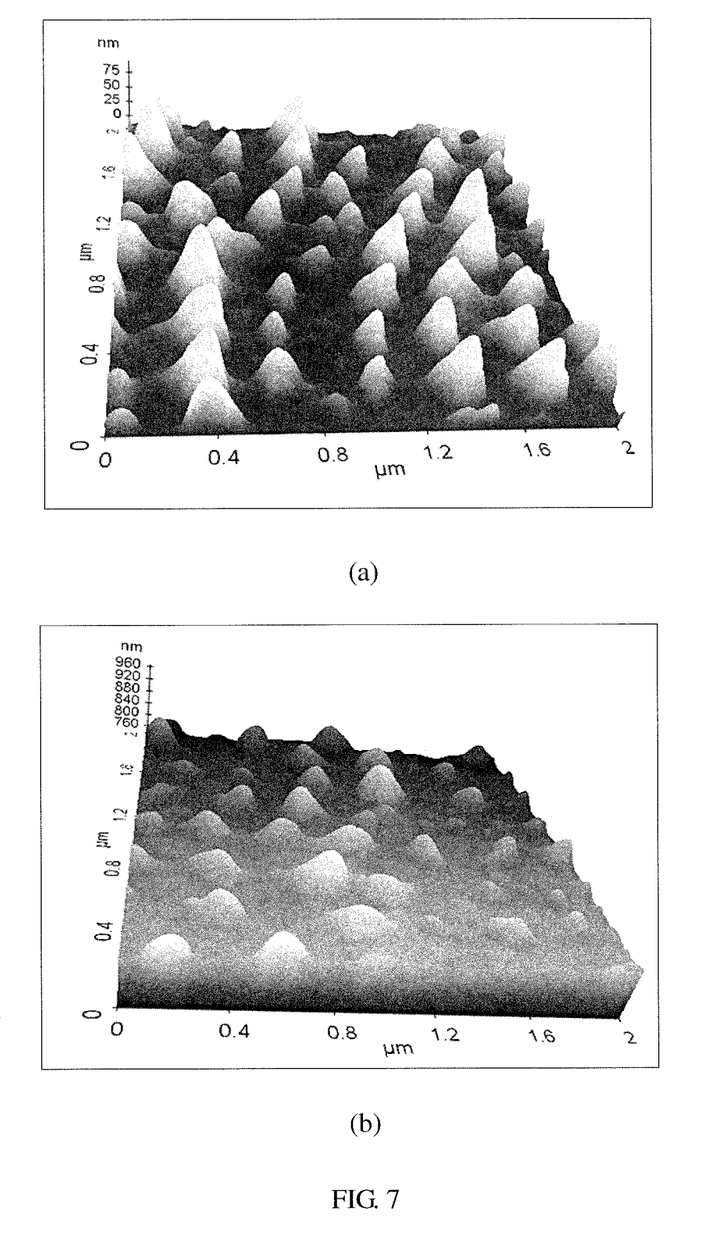

FIG. 7 illustrates atomic force microscope (AFM) micrographs analyzing the surface of the polysilicon manufactured by a traditional method (a) and that by the method in the embodiments of the present invention (b). Apparently, the polysilicon layer manufactured by the method in the embodiments of the present invention (b) has a significantly improved surface roughness and grain uniformity.

Figure 8:
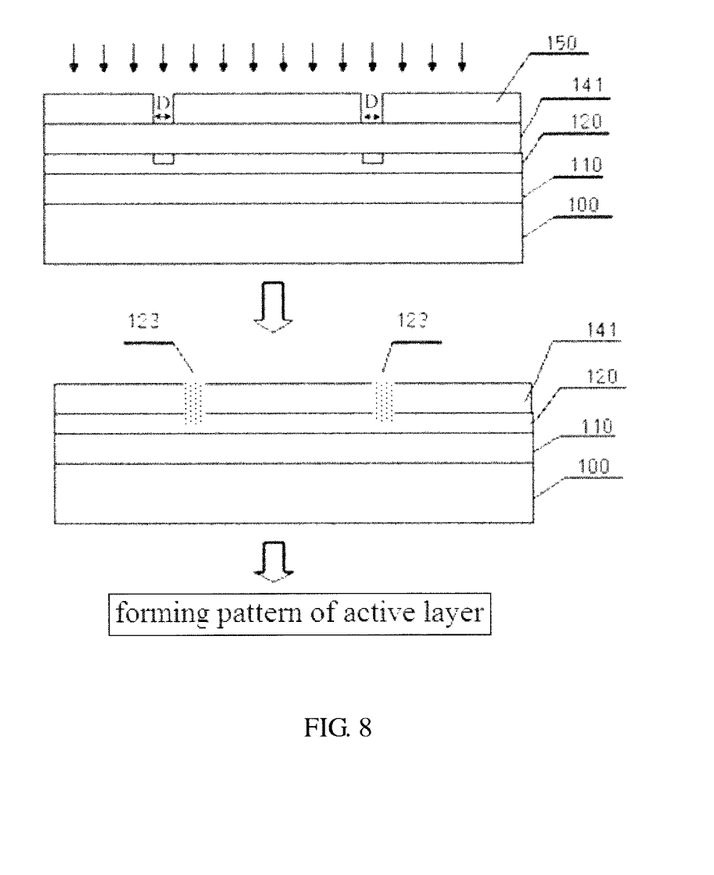
FIG. 8 is a schematic view of step 106 performing interfacial passivation on the polysilicon layer.

Further, the manufacturing method of a polysilicon layer in the present embodiments further comprises:

16. passivating the polysilicon layer 120 directly above the grooves 121 in order to reduce grain boundary defects.

To be specific, this step as illustrated in FIG. 8 comprises:

161. coating the polysilicon layer 141 with photoresist 150, forming, after exposure and development, a photoresist-completely-removed second window region (region D) at a position corresponding to the grooves 121;

162. performing ion implantation to passivate the polysilicon layer exposed from the second window region (region D);

163. removing the remaining photoresist.

Steps 161-163 coats the polysilicon layer 120 with photoresist 150, forms the second window region corresponding to the grooves 121 of the buffer layer by a strip patterning process, and then performing ion implantation to form a grain boundary passivation region 123. As illustrated in FIG. 8, the grain boundary passivation region is formed directly above the grooves 121 of the buffer layer.

After directional induced crystallization of the amorphous silicon in step 105, the grain boundary may be formed at a position corresponding to the grooves 121 of the buffer layer. Step 106 may directionally passivate the grain boundary and form the passivation layer 123 by ion implantation for controlling so as to reduce bad influence of grain boundary defects on the electric performance on the thin film transistor.

The embodiments of the present invention further provide a manufacturing method of a polysilicon thin film transistor, which differs from the traditional polysilicon thin film transistor manufacturing method in the process of forming polysilicon at the front end. The polysilicon layer is formed using any of the aforementioned manufacturing methods in the embodiments, the polysilicon layer being used to form an active layer of the polysilicon thin film transistor.

The embodiments of the present invention introduce the crystal seeds, the grooves of buffer layer and the crystal boundary passivation region into the process of forming polysilicon at the front end, and the process of forming the thin film transistor is the same, which will not be described in any more detail.

What needs to be pointed out is that the embodiments of the present invention may be used for manufacturing top gate (or bottom gate) type polysilicon thin film transistor.

With the traditional excimer laser annealing technique, the grain size to be formed is not uniform, the polysilicon thin film has a poor roughness, the grain boundary defects have a high density, and the thin film transistor has poor electric performance and reliability. The embodiments of the present invention make progress by introducing the crystal seeds, the grooves of buffer layer and the crystal boundary passivation region, which reduces the grain boundary defects and improve the electric performance of the thin film transistor.

The embodiments of the present invention further provide a polysilicon thin film transistor, the process of manufacturing the polysilicon thin film transistor including forming the polysilicon layer using the aforementioned manufacturing method of polysilicon layer, the polysilicon layer forming an active layer of the polysilicon thin film transistor.

Furthermore, the embodiments of the present invention provide an array substrate, comprising the aforementioned polysilicon thin film transistor.

Furthermore, the embodiments of the present invention provide a display device, comprising the aforementioned array substrate.

Although the embodiments of the present invention take the manufacturing of the polysilicon layer in LTPS back panel, it shall be understood that the application of the present invention is not limited to this, and the invention may be adapted to all occasions requiring polysilicon film layer.

The above embodiments of the present invention are given by way of illustration only and thus are not limitative of the protection scope of the present invention, which is determined by the attached claims.

What is claimed is:

1. A manufacturing method of a polysilicon layer, comprising:
    providing a substrate;
    forming a buffer layer on the substrate;
    disposing a plurality of grooves in the buffer layer by a patterning process, and forming crystal seeds on the buffer layer, forming a first amorphous silicon layer on the buffer layer; transferring the first amorphous silicon layer into a first polysilicon layer; applying photoresist on the first polysilicon layer; after a multi-tone or half-tone exposure and development, forming a photoresist-completely-removed first window region at a predetermined position where the grooves are subsequently formed, forming photoresist with a second thickness at a predetermined position where the crystal seeds are subsequently formed, and forming photoresist with a first thickness in other regions, the second thickness being greater than the first thickness; etching to remove the first polysilicon layer and a part of the buffer layer exposed from the first window region to form the grooves, ashing to remove the photoresist with the first thickness; etching to remove the first polysilicon layer to be exposed; ashing to remove a remaining part of the photoresist with the second thickness, to form the crystal seeds; wherein the plurality of grooves are arranged respectively along a first direction and a second direction intersecting the first direction to form an interleaved groove pattern;
    forming an amorphous silicon layer on the buffer layer provided with the grooves and on the crystal seeds;
    transferring the amorphous silicon layer into a polysilicon layer using a thermal treatment process.

2. The manufacturing method according to claim 1, wherein
    at least one of the crystal seeds is arranged on the buffer layer of a region surrounded by the adjacent grooves.

3. The manufacturing method according to claim 1, wherein the first amorphous silicon layer has a thickness of 10-20 nm.

4. The manufacturing method according to claim 1, further comprising:
    passivating the polysilicon layer directly above the grooves in order to reduce grain boundary defects.

5. The manufacturing method according to claim 4, wherein passivating the polysilicon layer directly above the grooves in order to reduce grain boundary defects comprises:
    applying photoresist on the polysilicon layer; after exposure and development, forming a photoresist-completely-removed second window region at a position corresponding to the grooves;
    performing ion implantation to passivate the polysilicon layer exposed from the second window region;
    removing the remaining photoresist.

6. The manufacturing method according to claim 1, wherein
    the grooves have a width of 5-10 μm, and
    an interval between the grooves is 10-20 μm.

7. The manufacturing method according to claim 1, wherein
    the thermal treatment process is a solid phase crystallization method or an excimer laser annealing method.

8. The manufacturing method according to claim 1, wherein prior to forming the buffer layer, the method further comprises:
    forming a barrier layer on the substrate.

9. The manufacturing method according to claim 1, wherein, after forming an amorphous silicon layer on the buffer layer provided with the grooves and on the crystal seeds and prior to transferring the amorphous silicon layer into a polysilicon layer using a thermal treatment process, the method further comprises:
    performing annealing and surface treatment on the amorphous silicon layer.

10. A manufacturing method of a polysilicon thin film transistor, comprising forming a polysilicon layer, which is used to form an active layer of the polysilicon thin film transistor, wherein the polysilicon layer is formed by using the manufacturing methods according to claim 1.

11. A polysilicon thin film transistor, wherein an active layer of the polysilicon thin film transistor is formed by the polysilicon layer manufactured by the manufacturing method according to claim 1.

12. The manufacturing method according to claim 2, wherein disposing a plurality of grooves in the buffer layer by a patterning process and forming crystal seeds on the buffer layer comprises:
    forming a first amorphous silicon layer on the buffer layer;
    transferring the first amorphous silicon layer into a first polysilicon layer;
    applying photoresist on the first polysilicon layer; after a multi-tone or half-tone exposure and development, forming a photoresist-completely-removed first window region at a predetermined position where the grooves are subsequently formed, forming photoresist with a second thickness at a predetermined position where the crystal seeds are subsequently formed, and forming photoresist with a first thickness in other regions, the second thickness being greater than the first thickness;
    etching to remove the first polysilicon layer and a part of the buffer layer exposed from the first window region to form the grooves;
    ashing to remove the photoresist with the first thickness;
    etching to remove the first polysilicon layer to be exposed;
    ashing to remove a remaining part of the photoresist with the second thickness, to form the crystal seeds.

13. The manufacturing method according to claim 2, further comprising:
    passivating the polysilicon layer directly above the grooves in order to reduce grain boundary defects.

14. The manufacturing method according to claim 2, wherein the grooves have a width of 5-10 μm, and an interval between the grooves is 10-20 μm.

15. The manufacturing method according to claim 2, wherein the thermal treatment process is a solid phase crystallization method or an excimer laser annealing method.

* * * * *